United States Patent
Backhaus

(10) Patent No.: US 7,554,336 B2
(45) Date of Patent: Jun. 30, 2009

(54) METHOD FOR MEASURING THE INSULATION RESISTANCE IN AN IT NETWORK

(75) Inventor: Klaus Backhaus, Fürth (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 172 days.

(21) Appl. No.: 11/825,428

(22) Filed: Jul. 6, 2007

(65) Prior Publication Data

US 2008/0007277 A1    Jan. 10, 2008

(30) Foreign Application Priority Data

Jul. 8, 2006  (DE) ................... 10 2006 031 663

(51) Int. Cl.
H01H 31/12 (2006.01)
G01N 27/00 (2006.01)
G01R 27/08 (2006.01)

(52) U.S. Cl. ............... 324/551; 324/557; 324/713

(58) Field of Classification Search ........... 324/557, 324/551, 713
See application file for complete search history.

(56) References Cited

U.S. PATENT DOCUMENTS 6,864,688 B2* 3/2005 Beutelschiess et al. ...... 324/551
7,317,316 B2* 1/2008 Leitz ........................... 324/551
2005/0151658 A1* 7/2005 Kono et al. ................. 340/647
2007/0001684 A1* 1/2007 Kawamura ................. 324/522

FOREIGN PATENT DOCUMENTS

EP      0 751 396      1/1997

* cited by examiner

Primary Examiner—Timothy J Dole
Assistant Examiner—Jeff Natalini
(74) Attorney, Agent, or Firm—Cohen Pontani Lieberman & Pavane LLP

(57) ABSTRACT

A method for measuring the insulation resistance in an information technology (IT) network. The IT network has a DC voltage intermediate circuit and at least one self-commutated converter having at least one first and one second power switch. The IT network also includes a measuring arrangement for measuring the intermediate circuit voltage relative to ground potential comprising a voltage divider and two assigned potential measuring devices. The method has an offline and an online measurement, wherein, during the offline measurement, all of one of the first and second power switches are closed and the potentials Up and Um, respectively, and also the intermediate circuit voltage are measured and the insulation resistance Rf is determined therefrom. During the online measurement, the two potentials Up and Um are measured and the temporal profile of the measurements is compared with the offline measurement.

6 Claims, 4 Drawing Sheets

METHOD FOR MEASURING THE INSULATION RESISTANCE IN AN IT NETWORK

BACKGROUND OF THE INVENTION

1. Field of the Invention

The invention is directed to a method for determining the insulation resistance in a terminated, fully insulated power supply network, a so-called IT network. IT networks of this type are used, for example, in vehicles.

2. Description of the Related Art

An IT network in accordance with the prior art has at least one power source, preferably a generator, at least one rectifier, an intermediate circuit having at least one capacitor, at least one converter and a measuring arrangement for the intermediate circuit voltage. An IT network is generally understood to be a network configuration in which the feeding power source is not grounded as usual. Consequently, in the event of a fault, such as an insulation fault, no closed electric circuit is established nor can any dangerous current flow through a body take place. Equally, in the event of a first fault, the operation of the IT network does not have to be stopped, which brings about a higher protection against failure. What is disadvantageous here, however, is that such a fault is also not identified as long as the insulation to ground is not measured by an insulation monitoring device.

On account of the above-described properties of IT networks, monitoring of the insulation at the beginning of operation and also during operation is particularly preferred. In this respect, EP 0 751 396 B1 describes a method for monitoring the insulation for faults, but implementation of the method requires a considerable additional expenditure on circuitry over and above that already present in the IT network.

Changes in the insulation resistance in an IT network also cause faults in the network, and have to be reliably identified by monitoring the network. Such faults include, by way of example, the ageing of the insulation, which results in a slow change in the insulation resistance that is often even symmetrical over all the phases. Another known fault case stems by way of example from damage to insulation, which brings about a faster change in the insulation resistance, usually of only one phase.

SUMMARY OF THE INVENTION

The invention is directed to a method for measuring the insulation resistance in an IT network, wherein the measurement reliably identifies symmetrical changes as well as asymmetrical changes in the resistance in an economically efficient manner.

The invention is intended for use in an IT network, preferably one having: a generator or some other power source; a DC voltage intermediate circuit fed by the power source; and at least one self-commutated converter. The converter has at least one first and one second power switch and a tap.

Furthermore, the IT network has a measuring arrangement for measuring the intermediate circuit voltage. The measuring arrangement preferably has a symmetrically formed voltage divider and two assigned measuring devices for measuring the two intermediate circuit potentials relative to ground.

The inventive method for measuring the insulation resistance comprises an "offline" measurement and an "online" measurement. During the offline measurement, by way of example at the beginning of operation, all of the first or second power switches of all the converters are closed. The two potentials of the intermediate circuit are measured while the network is in this switching state. If the measured potentials are unequal and also with knowledge of the measuring device, in the specific case of the measuring resistances, an insulation fault is reliably identified. The location of this fault can be determined by selectively opening the various power switches. It is likewise possible to test the function of the measuring arrangement itself by means of this offline measurement. If all of the switches are open, the two potentials of the intermediate circuit must be identical. When one switch is closed, the measured value must assume a known temporal profile. The transient phenomenon of the potential measurements that results from the parasitic load capacitance present is advantageously used for checking the insulation measuring device, whereby no additional hardware outlay is required to simulate an insulation fault.

During the online measurement during operation of the IT network, the two potentials again are measured and the temporal profile of this measurement is evaluated. In a first configuration, the two potentials measured are summed, this sum is subsequently Fourier-transformed and any change in the frequency spectrum is evaluated in terms of its temporal profile.

In a second configuration of the online measurement, the two potentials are summed, the magnitude of this sum is averaged and this average value is evaluated in terms of its temporal profile to determine the presence of a fault.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings.

The inventive solution is explained further on the basis of the preferred embodiments and FIGS. 1 to 6.

DETAILED DESCRIPTION OF THE PRESENTLY PREFERRED EMBODIMENTS

Figure 1:
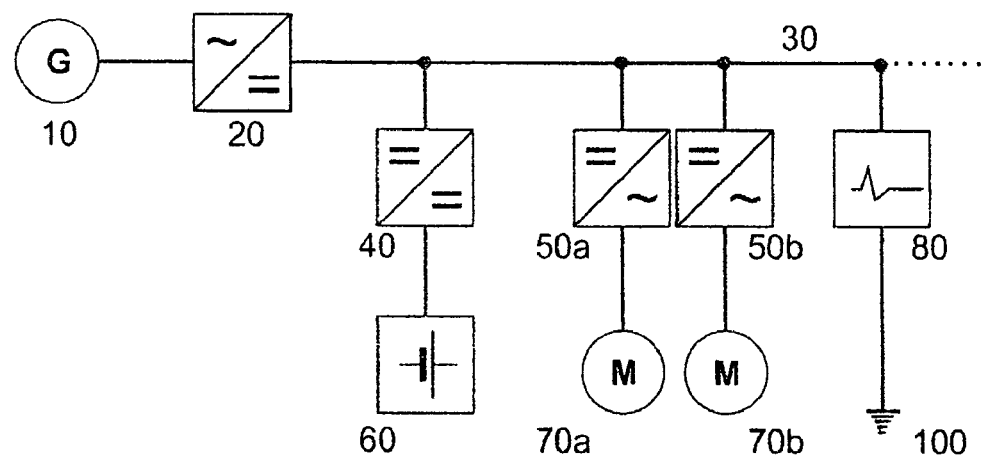
FIG. 1 shows an IT network in accordance with the prior art.

FIG. 1 shows an IT network in accordance with the prior art such as may be used in a road vehicle, for example. This IT network has a generator 10 for generating power, downstream of which is connected an active rectifier 20 for supplying a DC voltage intermediate circuit 30. Intermediate circuit 30 advantageously also has at least one capacitor for storing energy. A DC-DC voltage converter 40 with a battery 60 is connected to intermediate circuit 30. Two inverters 50a/b with respective motors 70a/b are here likewise connected to intermediate circuit 30. A measuring device 80 is also connected to measure the intermediate circuit voltage.

Figure 2:
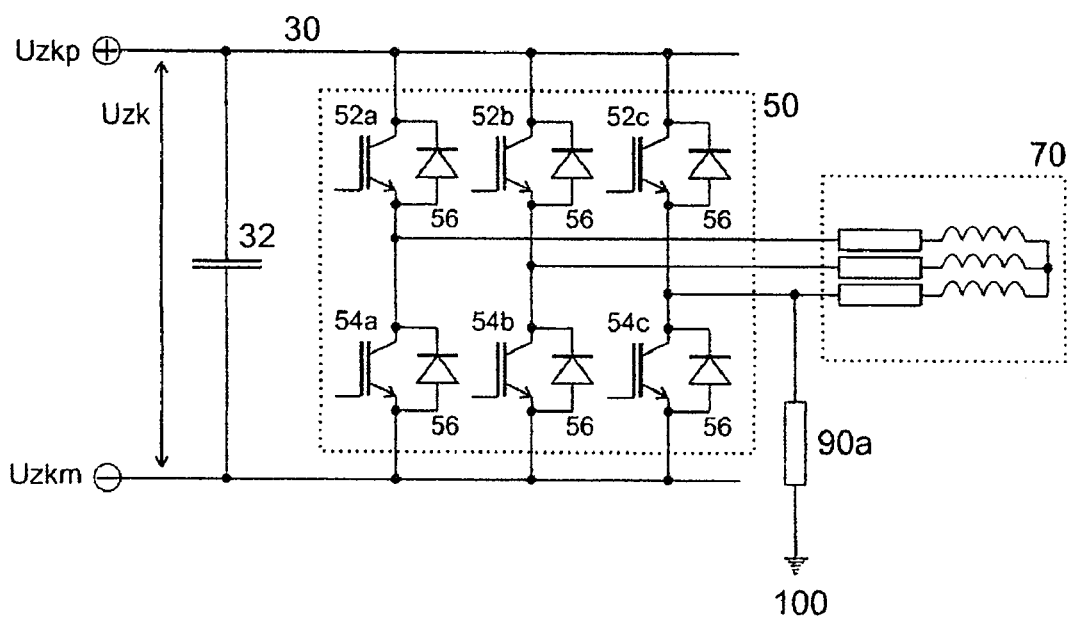
FIG. 2 shows an inverter and a motor in an IT network with a first exemplary insulation fault.

FIG. 2 shows an inverter 150 and a motor 170 in an IT network with a first insulation fault 190a. In this case, a DC voltage intermediate circuit 130 feeds a self-commutated inverter 150, wherein the latter has three first power switches 152a/b/c. Each power switch 152a/b/c comprises an antiparallel arrangement of at least one IGBT (insulated gate bipolar transistor) with at least one freewheeling diode 156. Inverter 150 likewise has three second power switches 154a/b/c formed with IGBTs and freewheeling diodes 156. The three first power switches 152a/b/c and second 154a/b/c power switches form the bridge circuit of three-phase inverter 150. Motor 170 is arranged at the output of the three phases. The impedances of motor 170 are represented in the form of a series connection of a non-reactive resistance and an inductance per phase.

First insulation fault 190a is symbolized as a resistance. The value Rf of resistance 190a is determined by the inventive method.

Figure 3:
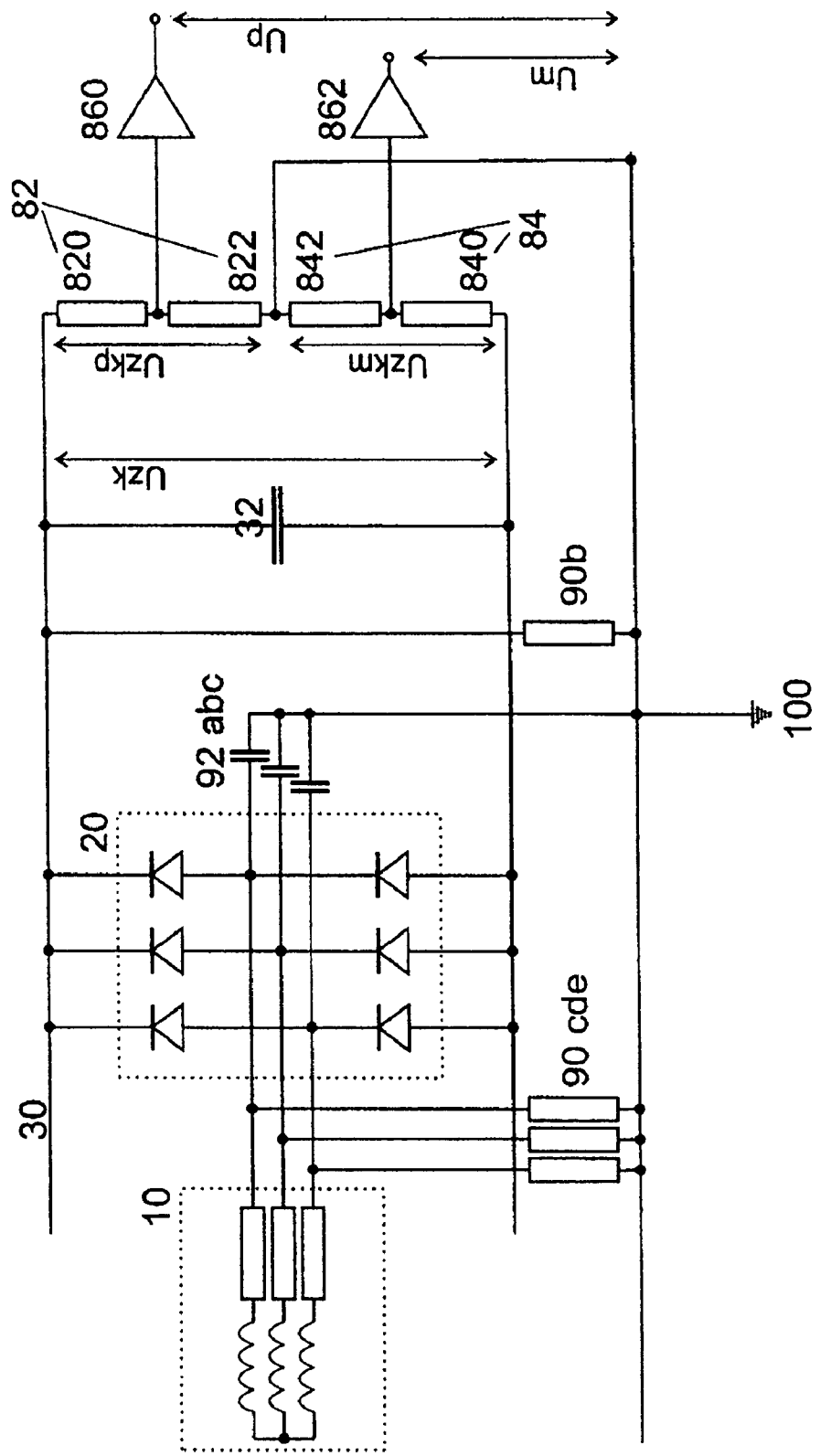
FIG. 3 shows a generator with a rectifier and a measuring device in an IT network with further exemplary insulation faults.

FIG. 3 shows further possible variants of insulation faults using the example of a generator 210 with rectifier 220 as part of an IT network. The illustration shows the internal resistances and inductances of generator 210, and also parasitic capacitors 292a/b/c of the order of magnitude of tenths of a nanofarad which, during operation of the IT network, contribute to the impedance thereof relative to ground.

Measuring devices 80 (FIG. 1) already contained in the IT network under consideration, for the regulation thereof in accordance with the prior art is likewise illustrated. The measuring device comprises first voltage dividers 82 and second voltage dividers 84. Voltage dividers 82, 84 are symmetrically disposed relative to tap 85 and are connected to the assigned intermediate circuit potential and also to ground 100. Consequently, a first potential (Uzkp) of intermediate circuit 230 is dropped across first voltage divider 82 and a second potential (Uzkm) is dropped across second voltage divider 84. Voltage dividers 82, 84 each comprise respective first resistors 820, 840 and second resistors 822, 842. Each respective first resistor 820, 840 is of the order of magnitude (R1) of megohms and each second resistor 822, 842 is of the order of magnitude (R2) of kilohms. The taps Tp, Tm, for measuring the assigned first (Up) and second (Um) potential (respectively) relative to ground is arranged between the two resistors in each case.

The illustration furthermore shows a plurality of resistances 290b/c/d/e, which represent different insulation faults (Rf) that can occur individually or in groupings. By way of example, a temporally slow change in the insulation, as by ageing of the IT network can be described by a uniform reduction of all the resistance values of resistances 290c/d/e.

By contrast, a reduction of the resistance value (Rf) of a single resistance, such as resistance 290b corresponds to a deterioration of the insulation of the first potential of intermediate circuit 230.

For the offline measurement and determination of the insulation resistance by means of a microcontroller that is part of measuring device 80, all of the first switches 152a/b/c or all of the second 154a/b/c switches of all the converters (cf. FIGS. 1 and 2) of the IT network are closed. In this configuration, all of the lines of the IT network are tested in their entirety by a measurement with regard to their insulation resistance and the insulation resistance of the entire IT network is thereby determined. This measurement requires only circuit parts of a measurement device 80 which, in accordance with the prior art, are already present in the IT network.

It is particularly preferred for the two parts of measuring device 80 to be formed symmetrically with respect to the midpoint 85 with connection to ground, whereby the measurement for example of an insulation fault 90a as illustrated in FIG. 2 is carried out as follows.

The intermediate circuit voltage (Uzk) can be expressed independently of the resistance value (Rf) of the insulation fault as:

$$Uzk=(((R1+R2) \cdot Up)/R2)+(((R1+R2) \cdot Um)/R2)$$

where Uzk=intermediate circuit voltage
R1=resistance value of resistors 820, 840
R2=resistance value of resistors 822, 842
Up=potential measured by measuring device 860
Um=potential measured by measuring device 862

The smaller the resistance value (Rf) of insulation fault 90a, the smaller the ratio of Up and Uzk becomes. In the event of a ground fault and thus a minimum value of Rf=0, Up is thus also equal to zero. Transformation of the above equation and elimination of Um yields:

$$Up=Uzk \cdot (R2/(R1+R2)) \cdot (Rf/(R1+R2 \cdot Rf))$$

with R1>>R2 this equation can be simplified as:

$$Up=Uzk \cdot (R2/R1) \cdot (1/((R1/Rf)+2)))$$

If R2/R1 is then chosen such that the measurement range of an A/D converter connected downstream is fully utilized, a minimum value to be detected for Rf of the order of magnitude of 10 kΩ results given a measuring accuracy of 1% and a measurement impedance of 1 MΩ, by way of example. This resolution is sufficient for the standard-conforming requirements for monitoring the insulation.

In order to localize the insulation fault, it is possible for individual first or second switches 152, 154 to be switched on, then for the measurement described to be repeated and thus the region in which the insulation fault is present may be determined.

Figure 4:
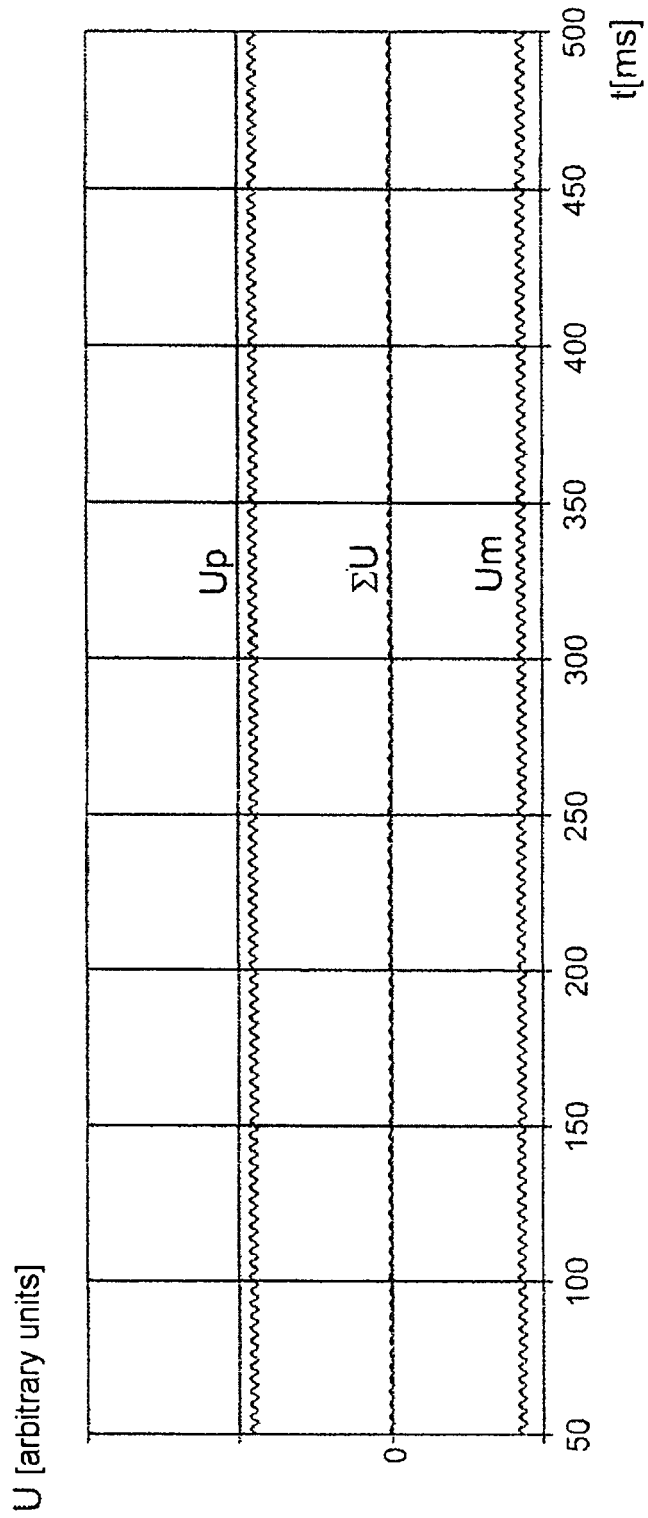
FIG. 4 shows potential profiles during an online measurement without insulation faults.

In contrast to the offline measurement described above, the online measurement is effected during normal operation of the IT network. An analytical calculation of the resistance value (Rf) is not practicable by means of a microcontroller, such as is part of a measuring device in accordance with the prior art, due to the variation and complexity, for example, of impedances 292a/b/c in the IT network. A first embodiment of the method according to the invention for online measurement is described by way of example with reference to FIGS. 3 and 4.

In the ideal case of an IT network operating without insulation faults, at every instant of operation, potentials Up and Um are symmetrical with respect to the ground potential and their magnitudes are therefore identical. A summation of Up and Um therefore yields the value (ΣU) of approximately zero (cf. FIG. 4). In this case, on account of a change in a measured value (Up or Um) of the assigned measuring device (860 or 862), an insulation fault would shift the value (ΣU) of summation away from the zero line, and the insulation fault (e.g., 90b, FIG. 3) would thus be identified as such.

A Fourier transformation of the summation value (ΣU) yields, without insulation faults whilst taking account of all the impedances, a frequency spectrum which can be calculated in the microcontroller and be stored for comparison with new calculations. The outlay for storing the measurements already carried out is advantageously reduced by the normalization of the values to be stored with the respectively set fundamental component of the inverter output voltage. Any insulation fault that occurs asymmetrically over three phases leads to a change in the frequency spectrum which can be identified by comparison with the stored values. These changes in the frequency spectrum may concern both the frequencies that occur and also the amplitudes thereof.

A fully symmetrical change in the insulation resistance of all three phases, that is to say a symmetrical change in the resistance value of resistances 290c/d/e is not possible with the first embodiment of the online measurement as described here.

Figure 5:
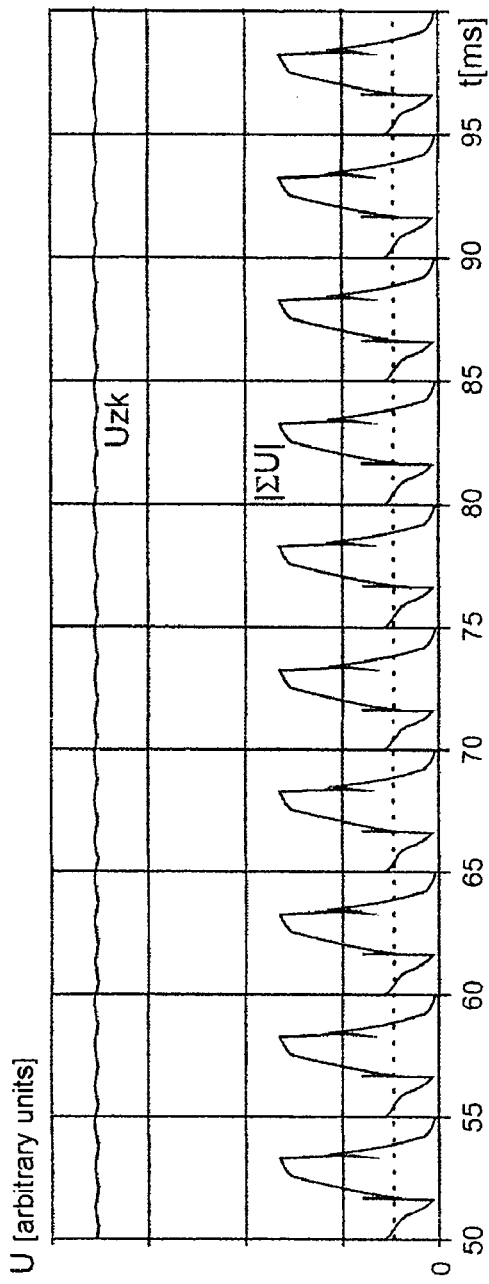
FIG. 5 shows the temporal profile of the magnitude of the sum of the measured values of an online measurement with a first insulation fault.
Figure 6:
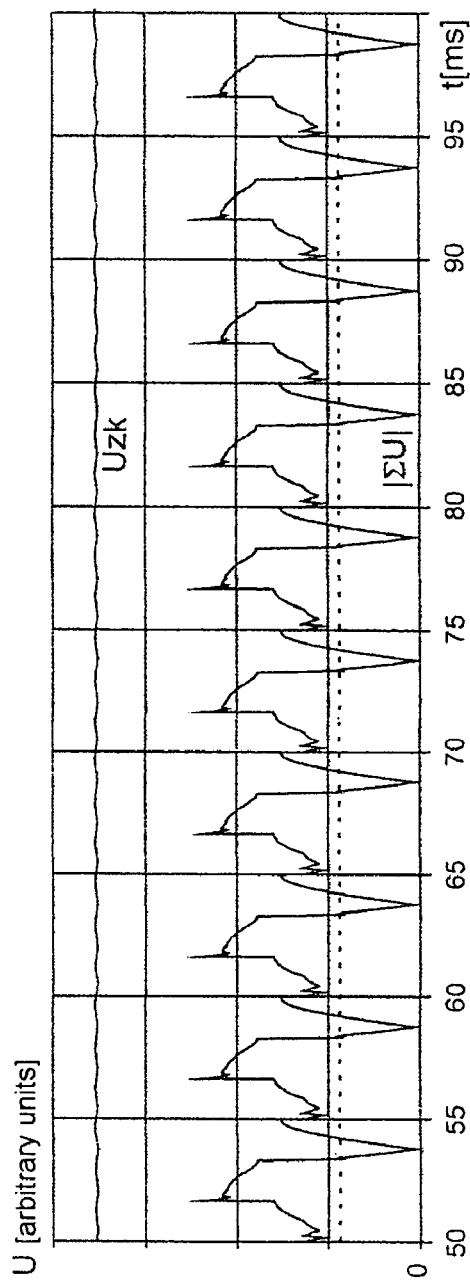
FIG. 6 shows the temporal profile of the magnitude of the sum of the measured values of an online measurement with a second insulation fault.

The second embodiment of the inventive method for online measurement is described by way of example with reference to FIGS. 3, 5 and 6. Here, the measured values of the potential measurement are added, the magnitude of the summation value ($\Sigma U$) is determined and the average of that magnitude with respect to time is also determined, and stored in the microcontroller. FIG. 5 shows the profile prior to averaging and also the average value for the case where an arbitrary one of resistances 290c/d/e (FIG. 3) has an exemplary value of 80 k$\Omega$. In comparison with this, FIG. 6 illustrates the profile wherein two arbitrary resistances from among resistances 90c/d/e (FIG. 3) have a value of 160 k$\Omega$ in each case and the insulation likewise as in FIG. 5 thus has a total resistance of 80 k$\Omega$.

A comparison of the present values with those stored in the microcontroller shows a variance, and that variance leads to the conclusion there is an insulation fault in the IT network.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for measuring the insulation resistance in an IT network, the network having
 a DC voltage intermediate circuit and at least one self-commutated inverter having at least one first power switch and at least one second power switch;
 a measuring arrangement for measuring an intermediate circuit voltage relative to ground, the measuring arrangement including a voltage divider; and
 means for measuring at least two potentials;
 the method comprising: an offline measurement and an online measurement,
 wherein, during the offline measurement, all of at least one of the first and second power switches are closed, a potential Up across the first power switches and a potential Um across the second power switches, and an intermediate circuit voltage Uzk are measured, and an insulation resistance Rf is determined therefrom,
 wherein during the online measurement, the two potentials Up and Um are measured and a temporal profile of the measurements is compared.

2. A method according to claim 1, further comprising the steps of
 summing potentials Up and Um during the online measurement;
 Fourier-transforming the sum; and
 determining if there is a change in the temporal profile of a frequency spectrum of potentials Up and Um.

3. A method according to claim 1, further comprising the steps of:
 summing potentials Up and Um during the online measurement;
 averaging the magnitude of the sum; and
 evaluating a temporal profile of the average value of the magnitude to determine thereby if there is a fault in the IT network.

4. A method according to claim 1, wherein
 during the offline measurement, a transient phenomenon of the potential measurements that results from a parasitic load capacitance present is used for functional checking of an insulation measuring device.

5. A method according to claim 1, wherein
 the voltage divider is formed symmetrically.

6. A method according to claim 1, wherein
 the first and second power switches are formed as IGBTs (insulated gate bipolar transistor) with antiparallel-connected freewheeling diodes.

* * * * *